(12) United States Patent
Boggs et al.

(10) Patent No.: US 7,583,513 B2
(45) Date of Patent: Sep. 1, 2009

(54) APPARATUS FOR PROVIDING AN INTEGRATED PRINTED CIRCUIT BOARD REGISTRATION COUPON

(75) Inventors: David W Boggs, Hillsboro, OR (US); John H Dungan, Hillsboro, OR (US); Daryl A Sato, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 246 days.

(21) Appl. No.: 10/668,745

(22) Filed: Sep. 23, 2003

(65) Prior Publication Data

US 2005/0063166 A1   Mar. 24, 2005

(51) Int. Cl.
*H05K 1/11* (2006.01)
*H05K 1/14* (2006.01)

(52) U.S. Cl. ............... 361/792; 361/794; 361/795; 174/264

(58) Field of Classification Search ......... 174/259–266; 361/792–795; 324/754–755, 760–765
See application file for complete search history.

(56) References Cited

U.S. PATENT DOCUMENTS

| | | | | |
|---|---|---|---|---|
| 3,859,711 A | * | 1/1975 | McKiddy | 29/593 |
| 5,418,690 A | * | 5/1995 | Conn et al. | 361/794 |
| 5,557,844 A | * | 9/1996 | Bhatt et al. | 29/852 |
| 6,084,779 A | * | 7/2000 | Fang | 361/763 |
| 6,147,505 A | * | 11/2000 | Ott et al. | 324/754 |
| 6,388,890 B1 | * | 5/2002 | Kwong et al. | 361/780 |
| 6,469,530 B1 | * | 10/2002 | Johnson et al. | 324/754 |
| 6,521,842 B2 | * | 2/2003 | Brinthaupt et al. | 174/252 |
| 6,778,043 B2 | * | 8/2004 | Stoddard et al. | 333/246 |
| 6,969,808 B2 | * | 11/2005 | Shiraki | 174/255 |

\* cited by examiner

*Primary Examiner*—Tuan T Dinh
(74) *Attorney, Agent, or Firm*—Schwegman, Lundberg & Woessner, P.A.

(57) ABSTRACT

A device includes a plane metallization layer, and a plane plated through hole attached to the plane metallization layer and terminating at the at a major exterior surface with a plurality of component mounting pads. The plated through hole is attached to the plane metallization layer. The plane plated through hole is electrically isolated from the plurality of component mounting pads at the exterior surface. A method for testing the device includes contacting the signal carrying through hole, and contacting the plane through hole, and checking for current flow between the signal carrying through hole and the plane through hole. If current flows between the signal carrying through hole and the plane through hole the device fails. If no current flows between the signal carrying through hole and the plane through hole the device passes.

11 Claims, 7 Drawing Sheets

APPARATUS FOR PROVIDING AN INTEGRATED PRINTED CIRCUIT BOARD REGISTRATION COUPON

FIELD OF THE INVENTION

The present invention is related to printed circuit boards. More specifically, the present invention relates to a method and apparatus for providing an integrated printed circuit board registration coupon.

BACKGROUND OF THE INVENTION

A printed circuit board ("PCB") is a multilayer plastic board that includes printed circuits on one or more layers of insulative material. A printed circuit is a pattern of conductors that corresponds to the wiring of an electronic circuit formed on one or more layers of insulative material. The printed circuit board includes electrical traces that are routed on the various layers of the PCB. PCBs also include vias which are solid electrical paths connecting one layer to another layer. A via can be used to connect a trace on one layer of a PCB to another trace on another layer of the PCB.

A PCB also includes other layers of metallization for ground planes, power planes or reference voltage planes. In many instances a signal carrying via must be routed through one or more of these planes. The signal carrying via can not electrically connect or couple to these planes. If the signal carrying via does couple or connect to one of these planes, the integrity of the electrical circuit is compromised. As a result, anti-pads or plane clearances, are required to separate signal carrying vias from ground planes, power planes, or planes having a reference voltage. An anti-pad is a plane clearance. Generally, a minimum anti-pad clearance is specified in the design after balancing factors that tend to minimize the anti-pad size and those factors that tend to maximize anti-pad size. The anti-pads would be minimized to reduce noise by closely shielding adjacent pins with reference planes, to reduce electromagnetic interference (EMI) by minimizing aperture sizes in reference planes, and to maintain a strong reference to ground for single-ended signals and ground referenced differential signals. The anti-pads would be maximized to maximize voltage breakdown spacing between the pin and the reference plane, to increase manufacturability by reducing the chance of shorting, and reduce reflection in a high speed gigabit serial system by reducing the capacitive effect of a plated through hole (used instead of a via).

The semiconductor industry has seen tremendous advances in technology in recent years that have permitted dramatic increases in circuit density and complexity, and equally dramatic decreases in power consumption and package sizes. Present semiconductor technology now permits single-chip microprocessors with many millions of transistors, operating at speeds of tens (or even hundreds) of MIPS (millions of instructions per second), to be packaged in relatively small, air-cooled semiconductor device packages. A by-product of such high density and high functionality in semiconductor devices is an ever increasing pressure to produce PCBs having higher density designs. With increasingly higher density designs, the risk becomes greater that the established industry reliability specification for minimum dielectric spacing between hole wall and adjacent conductive features will be violated. There is also a possibility that with increased device density, the industry will lower the minimum dielectric spacing between features.

Currently, there is no real-time process or method established to test individual PCBs for minimum inner layer coplanar dielectric spacing violations. In other words, there is no real-time process or method established to test a PCB to determine if the anti-pads meet specifications. Currently, destructive testing in the form of cross-sectional analysis is used to test minimum inner layer coplanar dielectric spacing. In an environment where each PCB is to be tested before populating the board with expensive components, destructive testing is not an option. Specialized processes, such as PerfecTest (available from American Testing Corporation, 18348 Redmond Way, Redmond, Wash. 98052), utilize coupons added to the manufacturing panel to align between levels or determine the cause of misalignment for a number of PCBs. The coupons do not allow for testing of individual PCBs within the manufacturing panels.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

In the following detailed description of the preferred embodiments, reference is made to the accompanying drawings that form a part hereof, and in which are shown by way of illustrating specific embodiments in which the invention can be practiced. The embodiments illustrated are described in sufficient detail to enable those skilled in the art to practice the teachings disclosed herein. Other embodiments can be utilized and derived therefrom, such that structural and logical substitutions and changes can be made without departing from the scope of present inventions. The following detailed description, therefore, is not to be taken in a limiting sense, and the scope of various embodiments of the invention is defined only by the appended claims, along with the full range of equivalents to which such claims are entitled.

Figure 1:
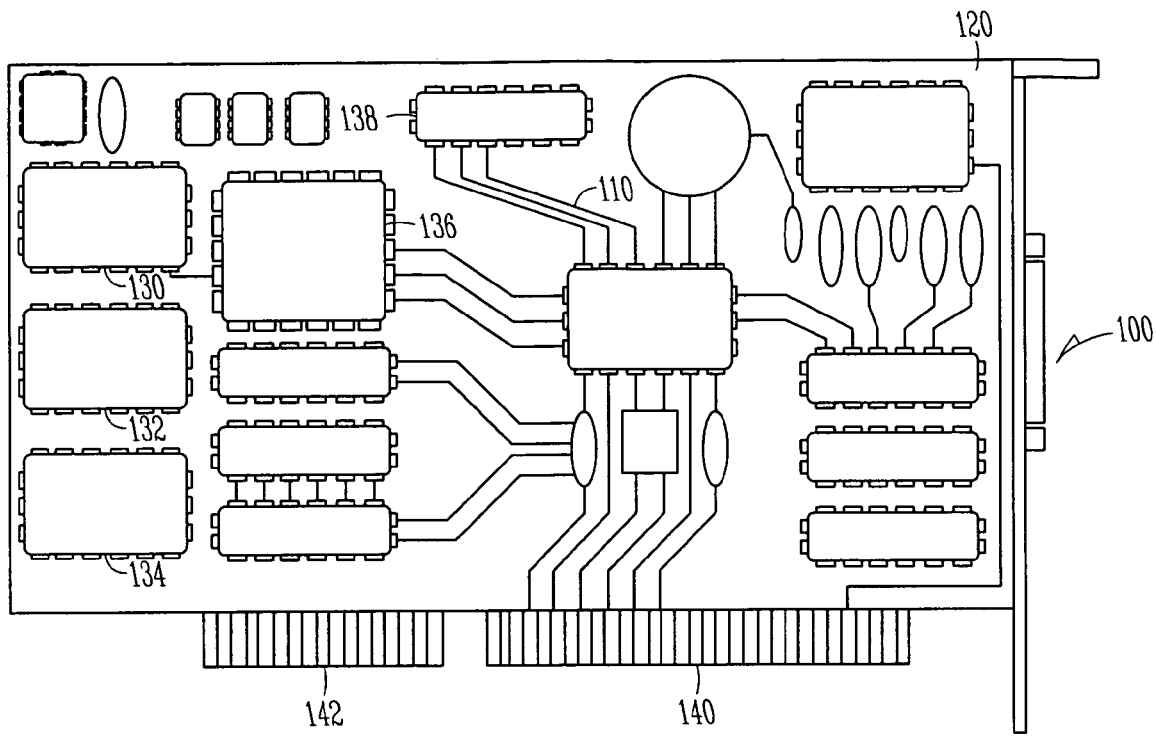
FIG. 1 is a top view of a printed circuit board, according to an embodiment of this invention.

FIG. 1 is a top view of a printed circuit board 100, according to an embodiment of the invention. The printed circuit board ("PCB") 100 is a multi-layer plastic board that includes patterns of printed circuits on one or more layers of insulated material. The patterns of conductors correspond to wiring of an electronic circuit formed on one or more of the layers of the printed circuit board 100. The printed circuit board 100 also includes electrical traces 110. The electrical traces 110 can be found on an exterior surface 120 of a printed circuit board 100 and also can be found on the various layers within the printed circuit board 100. Printed circuit boards also include through holes (not shown in FIG. 1 but shown in FIGS. 2-6) which are used to interconnect traces on various layers of the printed circuit board 100. A plated through hole is also referred to as a via. A via is a plated through hole not used for leaded component assembly. The printed circuit board can also include planes of metallized materials such as ground planes, power planes, or voltage reference planes (not shown in FIG. 1 but shown in FIGS. 2-6). Through holes can also be used to interconnect like planes in the printed circuit board 100. A through hole or via can either be a plated through hole which is essentially a hollow conductor formed within the printed circuit board 100 for interconnecting conductors or layers of a printed circuit board, or it can be a solid conductor used to interconnect layers of the printed circuit board 100. The through hole or via is formed by drilling and plating processes to form a hollow conductor. The via or through hole generally becomes filled by a subsequent surface treatment, such as hot air solder leveling.

The printed circuit board 100 is also populated with various components 130, 132, 134, 136, 138. The components 130, 132, 134, 136, 138 can either be discreet components or semiconductor chips which include thousands of transistors. The components 130, 132, 134, 136, 138 can use any number of technologies to connect to the exterior surface 120 of the circuit board or to the printed circuit board 100. For example, pins may be inserted into plated through holes or pins may be extended through the printed circuit board 100. An alternative technology is surface mount technology where an electrical component, such as component 136, mounts to an array of pads on the exterior surface 120 of the printed circuit board. For example, component 136 could be a ball grid array package or device that has an array of balls or bumps that interact or are connected to a corresponding array of pads on the exterior surface 120 of the printed circuit board 100. The printed circuit board 100 can also include connectors for making external connections to other electrical or electronic devices.

As shown in FIG. 1, the printed circuit board 100 includes a first edge connector 140 and a second edge connector 142. As shown in FIG. 1 there are external traces, such as electrical trace 110, on the external surface 120 of the printed circuit board 100 that connect to certain of the outputs associated with the first edge connector 140. Other traces that connect with the edge connectors 140, 142 will have traces internal to the printed circuit board 100.

Many of the electrical components which are used to populate the printed circuit board 100 are expensive. For example, a central processing chip, that may cost hundreds or thousands of dollars, is generally mounted on a printed circuit board 100. As a result, it is desirable to test the integrity of printed circuit boards, such as printed circuit board 100, before electrical components, such as electrical components 130, 132, 134, 136, 138, are mounted onto the printed circuit board 100. It should be noted that printed circuit boards are also called boards or circuit boards. Once populated many of the printed circuit boards are called cards or adapters. Printed circuit boards are prevalent and are used in computers and other devices. For example, printed circuit boards are used in computers and are referred to as motherboards, expansion boards, daughter cards, controller cards, network interface cards, or video adapters or video graphics adapters. It should be noted that these are just a small sample of the many different types of electronic devices that are based upon a printed circuit board, such as the one shown in FIG. 1.

Figure 2:
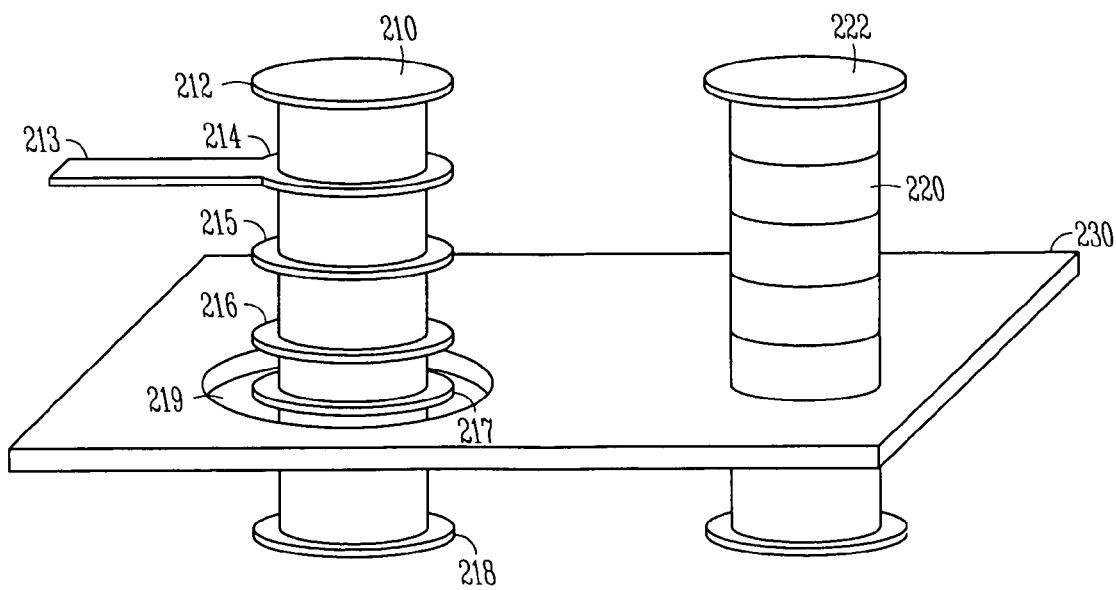
FIG. 2 is a signal carrying through hole and a plane through hole, according to an embodiment of this invention.

FIG. 2 shows internal portions of the printed circuit board 100, according to an embodiment of this invention. This figure shows a signal through hole 210 and a plane through hole 220. The plane through hole 220 is attached to a plane 230. The plane 230 is a layer of metallization within the internal layer of the printed circuit board 100 that is either a power plane, ground plane or a voltage reference plane.

As shown in FIG. 2, the signal carrying through hole 210 is a via. The plane through hole 220 is also a via. The signal carrying through hole 210 includes a pad 212 which corresponds to the exterior surface 120 (shown in FIG. 1) of the printed circuit board. The signal carrying through hole 210 also include other pads associated with the various layers of the printed circuit board 100. The signal carrying through hole 210 includes additional pads 214, 215, 216, 217 and 218. Attached to the electrical pad 214 is an electrical trace 213. The electrical trace 213 carries a signal from another portion of the electronic device associated with the print circuit board 100 (shown in FIG. 1). The signal carrying through hole 210 must only carry signals and not be affected by the electrical characteristics associated with the plane 230. For example, the signal carried in the signal carrying through hole 210 and the electrical trace 213 cannot be shorted to ground, for example, if the plane 230 is a ground plane. Similarly the signal carrying through hole 210 cannot touch or be affected by a voltage reference plane or a power plane. Since signal carrying through holes, such as 210, need to be routed through the plane 230 or through several planes (not shown), a space or spacing must be maintained between the signal carrying through hole and the plane 230. Industry standards dictate a minimum dielectric spacing between the wall of the signal carrying through hole 210 and the adjacent inner layer or plane 230. As shown, the anti-pad 219 is doughnut-shaped. The spacing is in the form of an anti-pad 219. The anti-pad 219 is a spacing between metallized plane 230 and the pad in the same layer as the metallized plane 230. The spacing is made of a dielectric material or insulated material. It should be noted that in another embodiment of the invention, the anti-pad is an opening providing complete clearance of the plane, rather than a doughnut-shaped anti-pad. In other words, there is no pad 217 as shown in FIG. 2. Rather the anti-pad is a clearance opening in the plane 230.

As mentioned previously, the plane through hole 220 is attached to the plane 230. The plane through hole 220 is attached to a pad 222 at the exterior surface 120 (shown in FIG. 1 and FIG. 3) of the printed circuit board 100. It should be noted that the pad 222 on the exterior surface or outer layer of the printed circuit board 100 is isolated from any other pad, such as any signal carrying pad, on the exterior surface 120 of the printed circuit board 100 (shown as FIG. 1).

Figure 3:
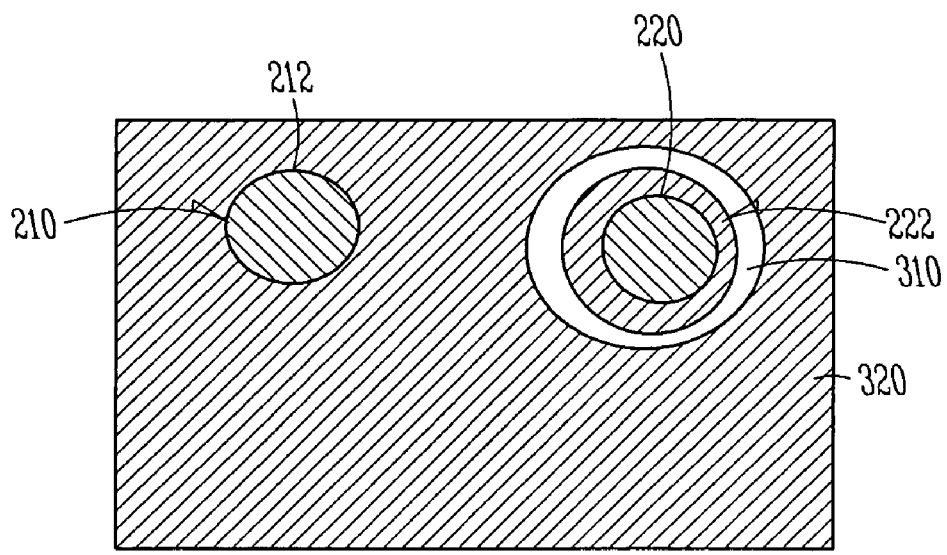
FIG. 3 is a top view of the outer or external component pad surface of the printed circuit board, according to an embodiment of this invention.

FIG. 3 shows a top view of the outer or external component pad surface 320 of a printed circuit board 100, according to an embodiment of this invention. As shown in FIG. 3 the outer or external component pad surface 320 is actually a larger pad to which the signal carrying through hole 210 is attached. Again it is important that the reference voltage plane, power plane or ground plane, not contact the signal carrying portions of the electronic circuit. Therefore the plane through hole 220 terminates at the outer external component pad surface 320 of the printed circuit board 100 as shown in FIG. 3. The component pad surface 320 is isolated from the plane through hole 220 and isolated from the exterior pad 222 by a spacing 310 between the exterior pad 222 of the plane through hole 220 and the outer or external component pad surface 320. Of course a minimum space 310 must be maintained between the exterior pad 222 of the plane through hole 220 and the component pad surface 320.

Figure 4:
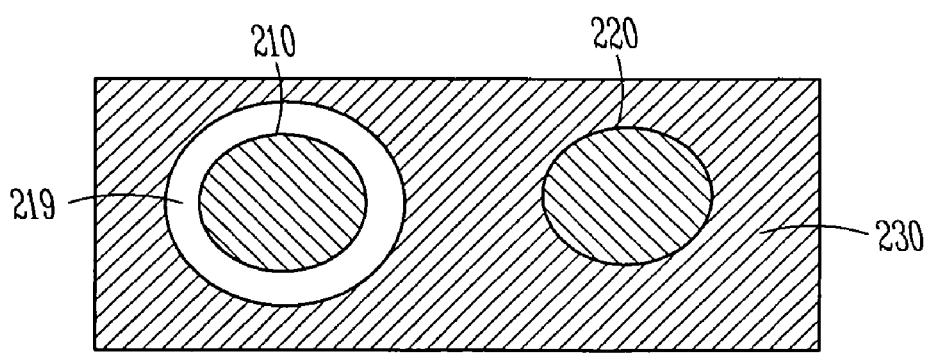
FIG. 4 is a top view of an inner layer carrying that includes a plane, according to an embodiment of this invention.

FIG. 4 is a top view of an inner layer of the printed circuit board 100, according to an embodiment of this invention. The inner layer shown includes the plane 230. The plane 230 is a voltage reference plane or a ground plane. In FIG. 4, the plane through hole 220 is attached to the plane 230. The signal carrying through hole 210 is not attached to the plane 230. The anti-pad 219 is a specified spacing or specified space between the plane 230 and the signal carrying through hole 210. It should be noted that the internal pad design is smaller since it does not require solder land spacing. The pad configuration shown in FIG. 4 is used for each inner layer that contains ground or power planes such as 230. It should also be noted that the annular ring of anti-pad 219 is to be a specific diameter according to the design of the printed circuit board. The diameter specified allows for minimum dielectric spacing requirements between the signal carrying through hole 210 and the plane 230.

One of the reasons for forming a printed circuit board or other device with a plane through hole 220 that terminates at an isolated exterior pad 222 at an outer layer of the printed circuit board 100, is so that the spacing between the signal carrying through hole 210 and the plane 230 can be tested. The isolated exterior pad 222 provides a test point for testing the anti-pad 219 spacing. In other words, if the layer that includes the plane 230 is not registered correctly with respect to the other layers of the printed circuit board 100, there is a possibility that the minimum spacing between the signal carrying through hole 210 and the plane 230 may not be maintained. Put another way the anti-pad 219 may not exist or may be shifted so that the distance between the plane 230 and the signal carrying through hole 210 is not within specified parameters. The plane through hole 220 with its exterior pad 222 allows for testing of the existence of the anti-pad 219.

Figure 5:
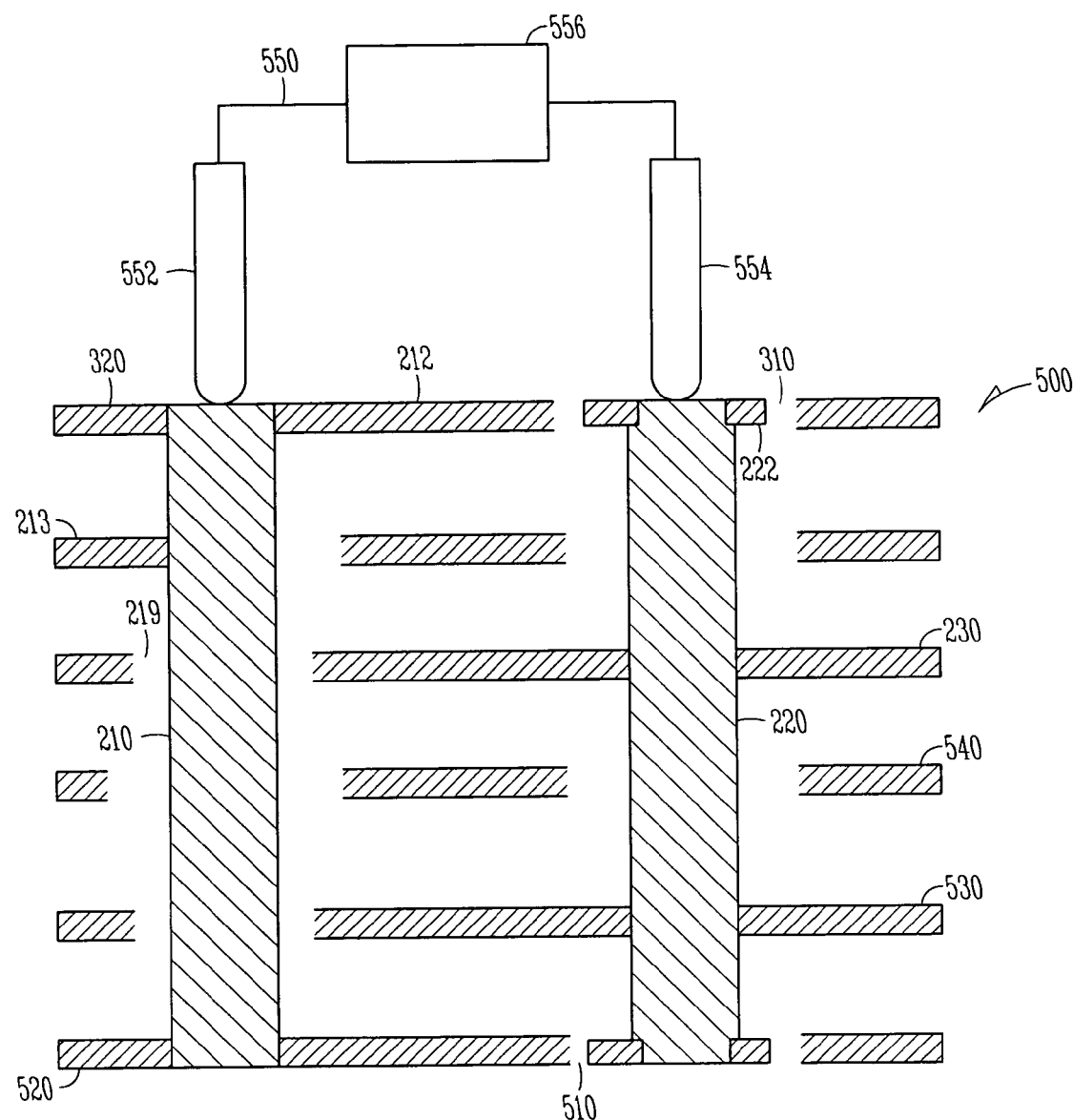
FIG. 5 is a cross-sectional view of a six-layer printed circuit board under test, according to an embodiment of this invention.

Now turning to FIGS. 4, 5 and 6, the testing of the printed circuit board and specifically the testing of the spacing between a plane 230 and a signal carrying through hole 210 will be discussed. FIG. 5 shows a cross sectional view of a portion of a printed circuit board 500 that is properly constructed and will pass an electrical test indicating that the spacing of the anti-pad 219 is appropriate. As shown in FIG. 5 the printed circuit board 500 includes the signal carrying through hole 210, and the plane through hole 220. The signal carrying through hole 210 terminates at the component pad surface 320 by connecting to the component pad surface 320 with exterior pad 212. It should also be noted that the signal carrying through hole 210 also extends to the other exterior major surface 520 of the printed circuit board 500. The plane through hole 220 also terminates at the component pad surface 320 but is electrically isolated by spacing 310 around the exterior pad 222. The plane through hole 220 also extends to the other major surface 520 of the printed circuit board 500 however, the plane through hole 220 is spaced away from, or is electrically isolated from, any pads on that exterior surface as shown by space 510 on external major surface 520.

It is also worthy to note that the printed circuit board also includes a second plane 530 to which the plane through hole 220 is attached. As a result the plane 230 and the plane 530 are the same type of plane, such as a power plane, voltage reference plane or ground plane. The printed circuit board 500 also includes another signal carrying layer 540.

A testing apparatus 550 is also shown in FIG. 5. The testing apparatus 550 includes a first probe 552 and a second probe 554. The testing apparatus 550 also includes test electronics 556. The first test probe 552 and the second test probe 554 correspond to the test probes associated with a bed of similar test probes. It should be noted that the test probes contact the signal carrying through hole 210 and the plane through hole 220 at the same time. Test electronics 556 attempts to pass a current between the plane through hole 220 and the signal carrying through hole 210. A signal or current can pass between the plane through hole 220 and the signal carrying through hole 210 if the anti-pad 219 was out of alignment, the through hole 210 is misaligned so that the plane 230 contacts the signal carrying through hole 210 or the spacing is too small to prevent current from passing between the features. As shown in FIG. 5, the anti-pad 219 maintains the spacing on both sides of the signal carrying through hole 210 and therefore does not conduct a current. An open is indicated between the signal carrying through hole 210 and the plane through hole 220. The open or inability to complete a circuit indicates proper registration of the layer that includes the plane 230 with respect to the signal carrying through hole 210. In other words, the anti-pad 219 is maintained and therefore the printed circuit board 500 passes. An open indicates a good part.

Figure 6:
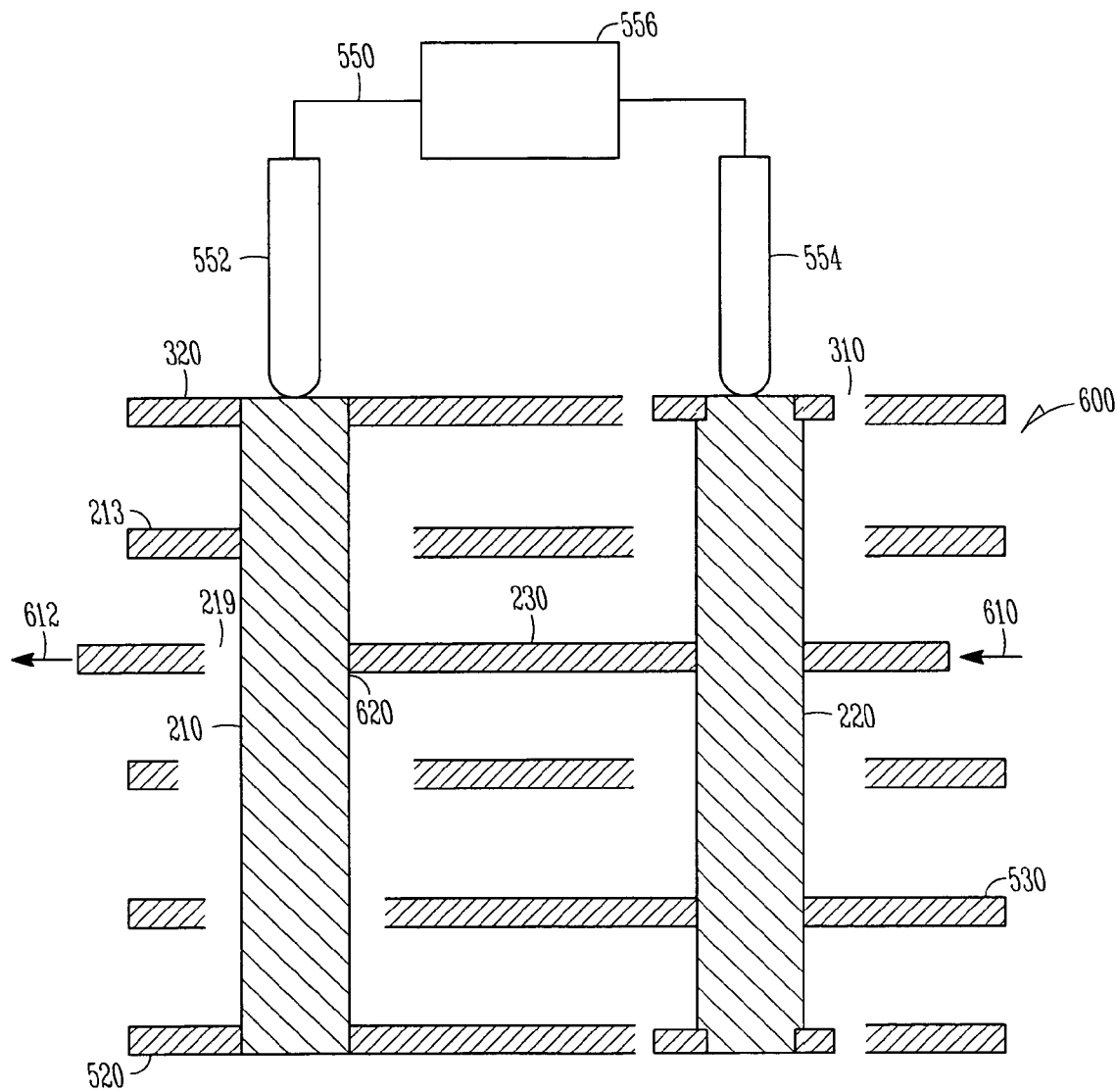
FIG. 6 is a cross-sectional view of another six-layer printed circuit board under test, according to an embodiment of this invention.

FIG. 6 shows another printed circuit board 600. The printed circuit board 600 has many of the same features as the printed circuit board 500. The features of the printed circuit board 600 which are the same as the features of the circuit board 500 will not be discussed or redescribed for the sake of brevity and clarity. As a result, only the difference between printed circuit board 600 and circuit board 500 will be described. The difference between printed circuit board 600 and printed circuit board 500 is that the layer of the printed circuit board 600 that includes the plane 230 has been shifted to the left as indicated by the arrows 610, 612. This would happen if the layer having the plane 230 thereon was misregistered with respect to the other layers of the printed circuit board. The result of shifting the plane 230 and the layer to the left is that the spacing between the plane 230 and the signal carrying through hole 210 is no longer maintained. As shown in FIG. 6 the anti-pad 219 is defective. On one side of the signal carrying through hole 210 there is a large space. On the other side of the signal carrying through hole 210, the plane 230 contacts the signal carrying through hole 210, as shown or depicted by reference number 620. As a result when the test electronics 556 attempt to pass a current from the plane 230 through plane through hole 220 to the signal carrying through hole 210, since the plane 230 contacts the signal carrying through hole 210 at point 620 a circuit is complete and current flows. Therefore, if current flows, the anti-pad 219 either does not exist or has been shifted so that the plane 230 now contacts the signal carrying through hole 210. As a result printed circuit board 600 fails and is a bad part, and is removed from the manufacturing process. Of course, printed circuit board 600 would not be populated with electrical components on either or both its exterior surfaces 320, 520.

It should also be noted that the second plane 530 as shown in FIG. 6 is also shifted and results in another electrical contact point between the plane through hole 220 and the signal carrying through hole 210. It should be noted that both planes need not necessarily shift and that one could shift in the absence of the other and still produce a failed part or bad printed circuit board 600.

There may also be other reasons for failure of the anti-pad 219. Described above with respect to FIG. 6, the failure was due to a shift in the plane. Failure of the test can also result from drill misregistration or incorrect placement of the via when drilled. If the via or through hole is incorrectly placed, the minimum spacing between the via and the other feature (such as a plane) will also be violated. Drill registration is another critical factor to test and is often the source of minimum dielectric space failures.

Figure 7:
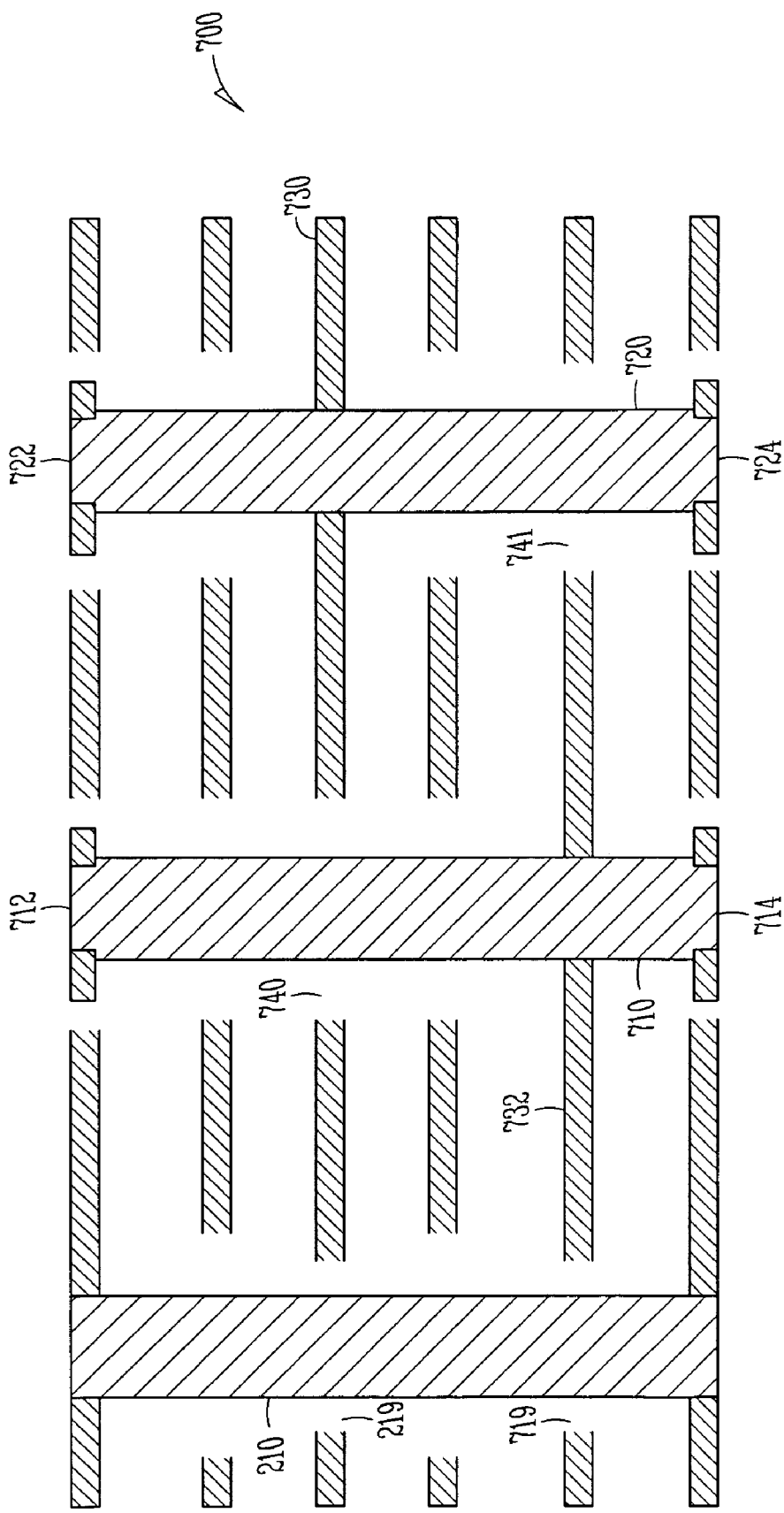
FIG. 7 is a cross-sectional view of another printed circuit board, according to an embodiment of this invention.

FIG. 7 shows yet another embodiment of this invention. FIG. 7 shows a printed circuit board 700 that includes a signal carrying through hole 210 and a first plane reference through hole 710 and a second plane through hole 720. The printed circuit board 700 includes a first plane 730 and a second plane 732. Plane 730 and plane 732 are different. For example, plane 730 could be a ground plane while the plane 732 may be a power plane. The first plane reference though hole 710 is attached to plane 732 and is electrically isolated from the first plane 730. The first plane reference through hole 710 terminates at the exterior surfaces of the printed circuit board 700 as a pad 712 and a pad 714 to provide a pair of test probe sites for testing an anti-pad 719. The first plane reference through hole 710 is attached to the metallization plane 732. The signal carrying through hole 210 is electrically isolated from plane 732 by the anti-pad 719. The anti-pad 719 is tested by trying to pass a current between the first reference plane through hole 710 and the signal carrying through hole 210.

Other through holes and anti-pads are also tested. First reference plane through hole 710 also includes an anti-pad 740 that prevents the first reference plane through hole 710 from contacting plane 730. In addition, second reference plane through hole 720 is prevented from contacting the metallization plane 732 by the anti-pad 741. Thus, the electrical integrity of the anti-pad 740 and 741 may be tested by placing a probe on the pad 712 or on the pad 714 of the reference plane through hole 710 and on a pad 722 or a pad 724 of the second reference plane through hole 720 and determining whether or not an electrical circuit is formed. If an electrical circuit is formed, one of the anti-pads 740 or 741 or both anti-pads 740, 741 are faulty and the printed circuit board 700 fails.

As discussed above with respect to FIGS. 1-7, this invention deals with a printed circuit board. It is contemplated that this invention could be used in any electronic device including printed circuit boards or other devices.

Figure 8:
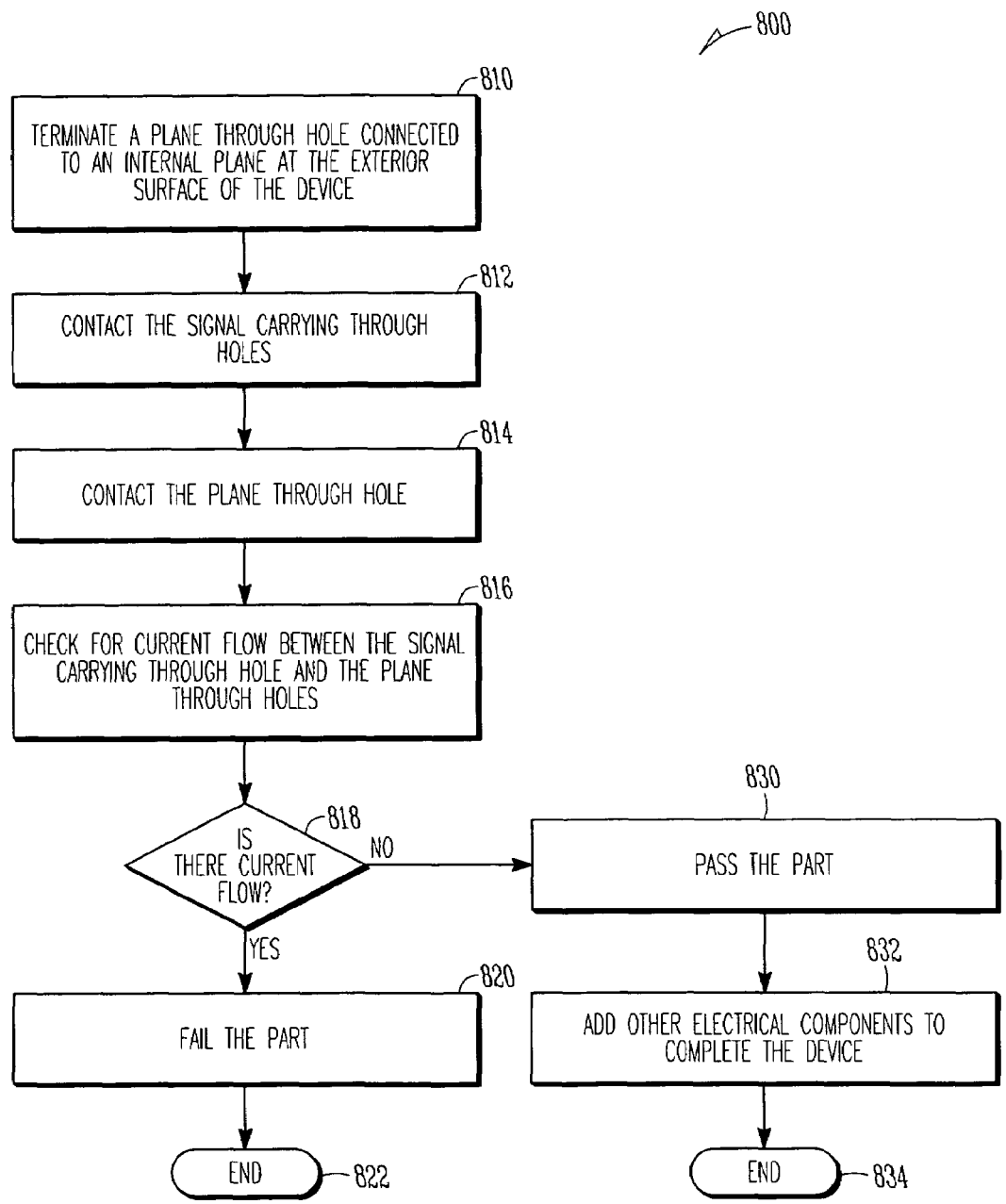
FIG. 8 is a flow diagram of a method for testing a printed circuit board, according to an embodiment of this invention.

FIG. 8 is a flow diagram of a method for testing a printed circuit board or device 800, according to an embodiment of this invention. The method for testing a device 800 having signal carrying through hole that passes though an internal plane within the device, and has a pad for connecting to the signal carrying through hole on the exterior surface of the device, includes terminating a plane through hole connected to an internal plane at the exterior surface of the device 810, contacting the signal carrying through hole 812, contacting the plane through hole 814, and checking for current flow between the signal carrying through hole and the plane through hole 816. Next, a decision is encountered as to whether current flows, as depicted by reference number 818. If current flows between the signal carrying through hole and the plane through hole the device fails 820 and the process ends 822. If no current flows between the signal carrying through hole and the plane through hole the device passes 830. In some embodiments, if the device passes, further electrical components are added to the device 832 and the process ends 834. In some embodiments, contacting the signal carrying through hole, and contacting the plane through hole is done from the same side of the device. In other embodiments, contacting the signal carrying through hole, and contacting the plane through hole is done substantially simultaneously.

It is contemplated that the invention can be used to test the dielectric spacing between a via and any electrical feature on a plane. The examples above deal mainly with power planes, ground planes and voltage reference planes. The dielectric spacing of any feature from a via or through hole can also be tested by placing a voltage across the through hole or via and the electrical feature and determining if current flows. If current flows, the dielectric spacing is insufficient. Traces on a plane near a via or through hole can be tested for dielectric spacing in this manner.

Figure 9:
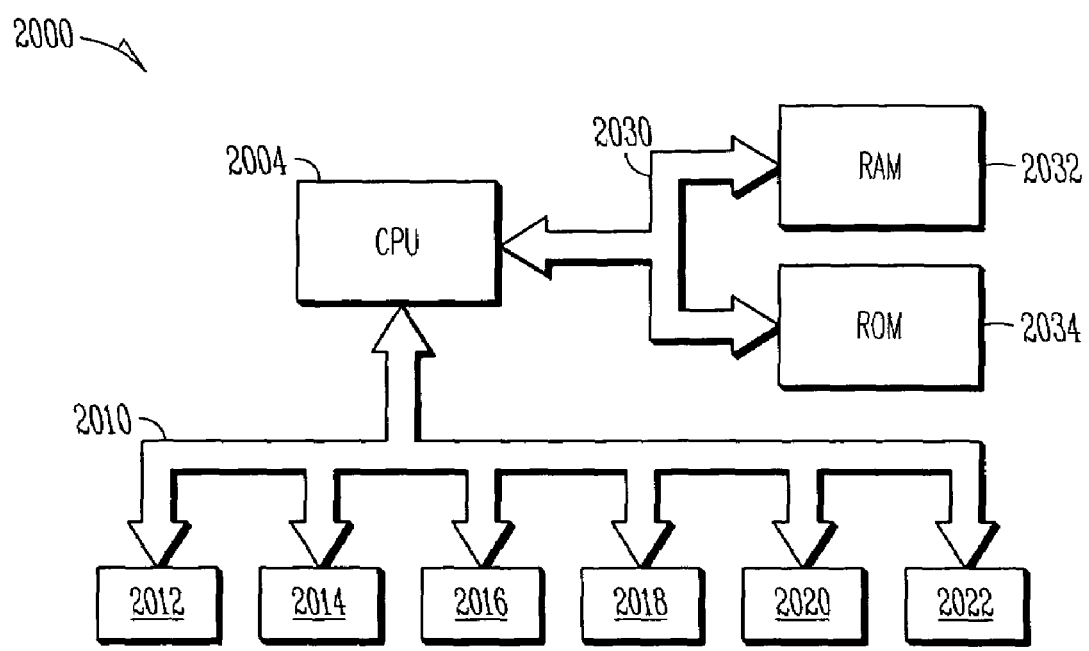
FIG. 9 is a schematical view of a computer system, according to an embodiment of this invention.

It is also contemplated that a device may be used as part of a computer system. FIG. 9 is a schematic view of a computer system 2000. Advantageously, the invention is well-suited for use in a computer system 2000. The computer system 2000 may also be called an electronic system or an information handling system and includes a central processing unit, a memory and a system bus. The information handling system includes a central processing unit 2004, a random access memory 2032, and a system bus 2030 for communicatively coupling the central processing unit 2004 and the random access memory 2032. The computer system 2000 may also include an input/output bus 2010 and several devices peripheral devices, such as 2012, 2014, 2016, 2018, 2020, and 2022 that can be attached to the input output bus 2010. Peripheral devices may include hard disc drives, magneto optical drives, floppy disc drives, monitors, keyboards and other such peripherals. Any type of disc drive may use the method for loading or unloading the slider onto the disc surface as described above.

The system 2000 includes a processor 2004, a memory 2032, 2034 communicatively coupled to the processor 2004, and a device associated with at least one of the memory or the processor. The device further includes a first major exterior surface, and a second major exterior surface. At least one of the first major exterior surface and the second major exterior surface of the device includes a plurality of component mounting pads. The device also includes a plane metallization layer within the device, and a plane plated through hole attached to the plane metallization layer and terminating at the at least one of the first major exterior surface and the second major exterior surface that has a plurality of component mounting pads. The plated through hole of the device is attached to the plane metallization layer. The plane plated through hole of the device is electrically isolated from the plurality of component mounting pads at the exterior surface. In some embodiments of the invention, the plane metallization layer of the device is a power plane, a ground plane, or a reference voltage plane. The signal carrying plated through hole terminates at a component mounting pad at the at least one of the first major exterior surface and the second major exterior surface including a plurality of component mounting pads. The signal carrying plated through hole is electrically isolated from the plane metallization. In some embodiments, the device forms a printed circuit board. In other embodiments, the device forms a semiconductor chip.

A device includes a first major exterior surface 320, and a second major exterior surface 520. At least one of the first major exterior surface 320 and the second major exterior surface 520 includes a plurality of component mounting pads 212. The device also includes a plane metallization layer 230 within the device, and a plane plated through hole 220 attached to the plane metallization layer 230 and terminating at the at least one of the first major exterior surface 320 and the second major exterior surface 520 that has a plurality of component mounting pads. The plated through hole 220 is attached to the plane metallization layer 230. The plane plated through hole 220 is electrically isolated from the plurality of component mounting pads at the exterior surface 320, 520. In some embodiments of the invention, the plane metallization layer 230 is a power plane, a ground plane, or a reference voltage plane. The device also includes a signal carrying plated through hole 210 that passes though the plane metallization layer 230 within the device. The signal carrying plated through hole 210 terminates at a component mounting pad 212 at the at least one of the first major exterior surface 320 and the second major exterior surface 520 including a plurality of component mounting pads. The signal carrying plated through hole 210 is electrically isolated from the plane metallization layer 230. In some embodiments, the device forms a printed circuit board. In other embodiments, the device forms a semiconductor chip. In some embodiments, the plated through hole is via.

A device includes a first major exterior surface 320, and a second major exterior surface 520. At least one of the first major exterior surface 320 and the second major exterior surface 520 including a plurality of component mounting pads 212. Within the device is a first plane metallization layer 230, and a second plane metallization layer 530. The device also includes a first plane plated through hole 220 attached to at least one of the first plane metallization layer 230 and the second plane metallization layer 530. The first plane plated through hole 220 terminates at the at least one of the first major exterior surface 320 and the second major exterior surface 520 including a plurality of component mounting pads. The first plated through hole 220 is attached to the plane metallization layer 230 and is electrically isolated from the plurality of component mounting pads. The device also includes a signal carrying plated through hole 210. The signal carrying plated through hole 210 passes though the first plane metallization layer 230 and is electrically isolated from the first plane metallization layer 230. The signal carrying plated through hole 210 also passes through the second plane metallization layer 530, the signal carrying through hole 210 connected to a component mounting pad at the at least one of the first major exterior surface 320 and the second major exterior surface 520 including a plurality of component mounting pads. In some embodiments, the first plane plated through hole 220 is attached to both the first plane metallization layer 230 and the second plane metallization layer 530. In other embodiments, the first plane plated through hole 710 is attached to the first plane metallization layer 730 and the device further includes a second plane plated through hole 720 attached to the second plane metallization layer 732. The second plated through hole 710 terminates at the at least one of the first major exterior surface and the second major exterior surface that includes a plurality of component mounting pads. The second plated through hole 710 is attached to the second plane metallization layer 732 is electrically isolated from the plurality of component mounting pads.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A device forms a printed circuit board, said printed circuit board comprising:
   a first major exterior surface;
   a second major exterior surface, at least one of the first major exterior surface and the second major exterior surface including a plurality of component mounting pads;
   a signal carrying plated through hole terminating at the at least one of the first major surface and the second major exterior surface;
   a pad between the first major surface and the second major surface, the signal carrying plated through hole connected to the pad;
   an antipad element substantially surrounding the pad;
   a plane metallization layer within the device substantially surrounding the pad and the antipad;
   a plated through hole attached to the plane metallization layer and terminating at the at least one of the first major exterior surface and the second major exterior surface including the plurality of component mounting pads, the plated through hole attached to the plane metallization layer, and electrically isolated from the plurality of component mounting pads; and
   a circuit tester to determine if a current will flow between the pad and the signal carrying via, and the plane metallization layer to test the spacing of the plane metallization layer from the signal through hole that passes through the plane metallization layer.

2. The device of claim 1 wherein the plane metallization layer is a power plane.

3. The device of claim 1 wherein the plane metallization layer is a ground plane.

4. The device of claim 1 wherein the plane metallization layer is a reference voltage plane.

5. The device of claim 1 wherein the signal carrying plated through hole which passes though the plane metallization layer within the device and terminates at the component mounting pad at the at least one of the first major exterior surface and the second major exterior surface including the plurality of component mounting pads.

6. The device of claim 1 wherein the plated through hole is a via.

7. The device of claim 5 wherein the signal carrying plated through hole which passes though the plane metallization layer is electrically isolated from the plane metallization layer and is connected to the component mounting pad at the at least one of the first major exterior surface and the second major exterior surface including the plurality of component mounting pads.

8. A system comprising:
   a processor;
   a memory communicatively coupled to the processor; and
   a device comprising: a printed circuit board, associated with at least one of the memory or the processor further including:
   a first major exterior surface;
   a second major exterior surface, at least one of the first major exterior surface and the second major exterior surface including a plurality of component mounting pads;
   a signal carrying plated through hole terminating at the at least one of the first major surface and the second major exterior surface;
   a pad between the first major surface and the second major surface, the signal carrying plated through hole connected to the pad;
   an antipad element substantially surrounding the pad;
   a plane metallization layer substantially surrounding the pad and antipad within the device; and
   a plated through hole attached to the plane metallization layer and terminating at the at least one of the first major exterior surface and the second major exterior surface including the plurality of component mounting pads, the plated through hole attached to the plane metallization layer electrically isolated from the plurality of component mounting pads; and
   a circuit test apparatus to test the spacing between the plane metallization layer and the pad associated with the signal carrying through hole.

9. The system of claim 8 wherein the plane metallization layer is a ground plane.

10. The system of claim 8 wherein the plane metallization layer is a power plane.

11. The system of claim 8 wherein the plane metallization layer is a reference voltage plane.

* * * * *